US012618926B2

(12) United States Patent
Kamba et al.

(10) Patent No.: US 12,618,926 B2
(45) Date of Patent: May 5, 2026

(54) MAGNETIC RESONANCE IMAGING APPARATUS AND CONTROL METHOD THEREOF

(71) Applicant: FUJIFILM Healthcare Corporation, Kashiwa (JP)

(72) Inventors: Kazuho Kamba, Chiba (JP); Masahiro Takizawa, Chiba (JP); Taisei Ueda, Chiba (JP); Nobuyuki Yoshizawa, Chiba (JP); Atsushi Kuratani, Chiba (JP); Kosuke Ito, Chiba (JP)

(73) Assignee: FUJIFILM Corporation, Tokyo (JP)

( * ) Notice: Subject to any disclaimer, the term of this patent is extended or adjusted under 35 U.S.C. 154(b) by 152 days.

(21) Appl. No.: 18/368,653

(22) Filed: Sep. 15, 2023

(65) Prior Publication Data

US 2024/0111009 A1    Apr. 4, 2024

(30) Foreign Application Priority Data

Sep. 30, 2022    (JP) ................................. 2022-158509

(51) Int. Cl.
*G01R 33/54* (2006.01)
*G01R 33/483* (2006.01)

(52) U.S. Cl.
CPC ....... *G01R 33/543* (2013.01); *G01R 33/4833* (2013.01); *G01R 33/546* (2013.01); *G01R 33/4835* (2013.01)

(58) Field of Classification Search
CPC ............ G01R 33/543; G01R 33/56509; G01R 33/4835; G01R 33/4833; G01R 33/546; A61B 5/055; A61B 5/7207
See application file for complete search history.

(56) References Cited

U.S. PATENT DOCUMENTS

| | | | | |
|---|---|---|---|---|
| 2016/0245887 | A1* | 8/2016 | Tomoda | G01R 33/4835 |
| 2018/0110424 | A1* | 4/2018 | Giri | A61B 5/0263 |
| 2018/0348322 | A1 | 12/2018 | Feiweier | |
| 2019/0227134 | A1* | 7/2019 | Taniguchi | A61B 5/055 |

FOREIGN PATENT DOCUMENTS

| | | |
|---|---|---|
| CN | 107536609 B | 6/2020 |

OTHER PUBLICATIONS

European search report dated Feb. 16, 2024 in connection with European Patent Application No. 23 19 8655.
Guobin Li et al., "Concomitant and seamless saturation bands for suppressing flow artifacts in FSE sequences", Proc Int'l Soc Magn Reson Med, vol. 24, 1854 (Apr. 22, 2016).
Markus Barth et al., "Simultaneous multislice (SMS) imaging techniques", Magn Reson Med, vol. 75, No. 1, pp. 63-81 (2016).
Mar. 17, 2026 Japanese official action (and English-language translation thereof) in connection with Japanese Patent Application No. 2022-158509.

\* cited by examiner

*Primary Examiner* — Rishi R Patel
(74) *Attorney, Agent, or Firm* — Paul Teng

(57) ABSTRACT

Preventing blood flow artifacts from being increased in an imaging plane allows reduction of the blood flow artifacts in the cross section subsequently excited. In the imaging using a spin-echo (SE) pulse sequence, an excitation width of a 90° pulse is extended from an imaging plane to one side. This one side indicates a downstream side of the blood flow with respect to a vessel of interest. In imaging multiple slices, the order of measuring the multiple imaging slices is set along the direction in which the width is extended.

11 Claims, 9 Drawing Sheets

MAGNETIC RESONANCE IMAGING APPARATUS AND CONTROL METHOD THEREOF

TECHNICAL FIELD

The present invention relates to a magnetic resonance imaging apparatus (hereinafter, referred to as an MRI apparatus), and more particularly, the present invention relates to control of a pulse sequence for measuring a nuclear magnetic resonance signal in the MRI apparatus.

DESCRIPTION OF THE RELATED ART

In an MRI apparatus, nuclear magnetic resonance signals generated from an examination subject caused by nuclear magnetic resonance are collected to create an image of the examination subject. The nuclear magnetic resonance signals are collected by operating a pulse sequence. In the pulse sequence, there are determined application intensity and the order of application to apply pulses, such as RF pulses for exciting nuclear spins (normal protons) of atoms in the tissue of the examination subject and gradient magnetic field pulses for adding position information to the nuclear magnetic resonance signals. Even when the nuclear magnetic resonance signals are generated from the same nuclear spin, the signal intensity and phase vary depending on the tissue where the nuclei are present. Thus, imaging is performed with settings of the pulse sequence and imaging conditions that allow enhancement of ability for visualizing the tissue, in response to properties of the tissue as a target of the imaging.

A typical one of pulse sequences used in the MRI apparatus is a spin echo (SE) type pulse sequence (hereinafter, also referred to as an "SE pulse sequence") that uses an excitation pulse (90° pulse) and a 180° pulse to measure a nuclear magnetic resonance signal generated in the form of a spin echo (echo signal). For example, this pulse sequence is utilized for taking a T1 enhanced image reflecting a time constant of a longitudinal relaxation time of tissue.

In the imaging using the SE pulse sequence, since nuclear spins in blood that flows through the imaging plane depend on the velocity of the blood flow, there occurs a phase change different from that of the nuclear spins from stationary tissue in the imaging plane. Thus this causes a flow artifact along the phase-encoding direction in a reconstructed image. In general, there are widely known methods for reducing this kind of flow artifact, including following methods; a method of adding a flow compensation pulse for canceling the phase change of the spins of fluid at the time of collecting echo signals, and a method of applying a pre-saturation pulse for previously saturating spins in a nearby region outside the imaging target region to control the signals.

Chinese Patent No. 107536609 (hereinafter, referred to as Patent Literature 1) suggests that in the imaging using the SE pulse sequence, an excitation thickness is increased in either of a 90° pulse and a 180° pulse. In this technique, the center frequency positions of the 90° pulse and the 180° pulse are not changed, and one excitation width is extended to be wider than the other, thereby preventing the fluid, e.g., blood, excited in one cross section, from flowing into the next cross section and interfering with image formation of the next cross section, resulting in that this reduces the flow artifact.

SUMMARY OF THE INVENTION

Technical Problem

In the technique disclosed in Patent Literature 1, the regions on both sides adjacent to the imaging plane are excited by the 90° pulse or the 180° pulse, so that magnetization of the excited regions does not contribute to forming an image of the imaging plane, and the magnetization is reduced in the next cross section. However, when focusing on the imaging plane, the blood located on the upstream side of the cross section and excited by the 90° pulse or the 180° pulse, that is, the blood having extra magnetization, flows into the imaging plane, resulting in that this increases artifacts.

An object of the present invention is to prevent the increase of the blood flow artifacts in the imaging plane, so that the blood flow artifacts can be reduced in the cross section to be excited next.

Solution to Problem

In order to solve the above-described problem, in the imaging using an SE pulse sequence, the excitation width of a 90° pulse is extended to one side from the imaging plane. The one side is assumed as the downstream side of a blood flow with respect to a vessel of interest. When imaging of multiple cross sections is performed, the order of measuring the imaging planes is set along the direction in which the width is extended.

That is, an MRI apparatus of the present invention comprises a measurement unit configured to apply an RF pulse for exciting a predetermined cross section of the examination subject and a gradient magnetic field pulse, and to collect nuclear magnetic resonance signals generated from the predetermined cross section, and a measurement control unit configured to control the measurement unit so that the measurement unit collects the nuclear magnetic resonance signals according to a spin-echo pulse sequence. The measurement control unit controls at least either of the excitation pulse and the gradient magnetic field pulse in such a manner that a width in the thickness direction of the predetermined cross section excited by the excitation pulse in the spin-echo pulse sequence, includes the predetermined cross section and a region adjacent to the predetermined cross section on the downstream side of a liquid that flows into the predetermined cross section.

Further, a control method of the magnetic resonance imaging apparatus provided with an RF magnetic field generation unit configured to generate an RF magnetic field to be applied to an examination subject, a gradient magnetic field generation unit configured to generate a gradient magnetic field in a space in which the examination subject is placed, and a measurement unit configured to measure a nuclear magnetic resonance signal generated from the examination subject, the MRI apparatus being operated according to a predetermined pulse sequence, and as the pulse sequence, a spin-echo pulse sequence is used including application of a 90° pulse and application of a 180° pulse and measures a spin echo from a predetermined cross section of the examination subject. Then, the nuclear magnetic resonance signals are collected from the predetermined cross section, with setting a range excited by the 90° pulse as a range that includes the predetermined cross section and a cross section adjacent to the predetermined cross section and located on the downstream side of a fluid flowing into the predetermined cross section, and setting a range to apply the 180° pulse to coincide with the range of the predetermined cross section. Collection of the nuclear magnetic resonance signals is repeated while shifting the predetermined cross section to the downstream side.

According to the present invention, it is possible to reduce artifacts caused by the fluid flowing into the imaging plane, and also to reduce artifacts caused by the fluid flowing into another cross section on the downstream side of the imaging plane. As a result, an image can be obtained with reduced flow artifacts in the entire volume of the examination subject.

DETAILED DESCRIPTION OF THE PREFERRED EMBODIMENTS

Figure 1:
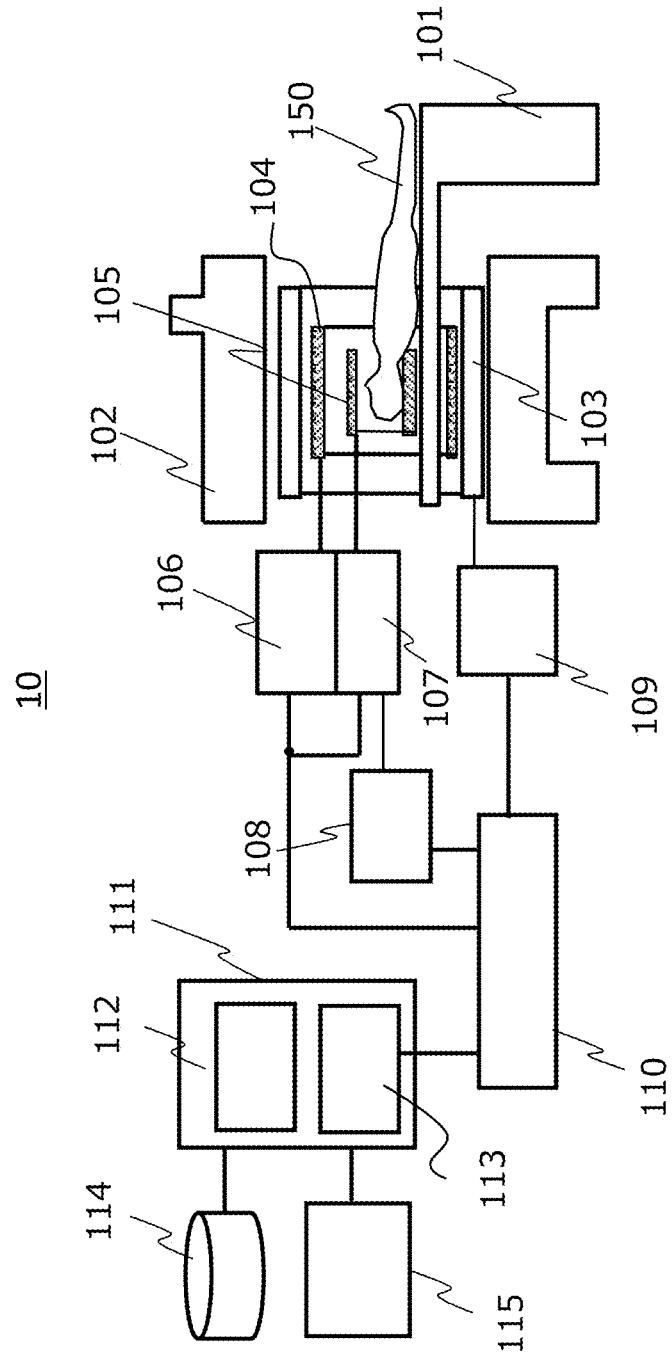
FIG. 1 illustrates an entire configuration of an MRI apparatus to which the present invention is applied.

There will now be described embodiments of an MRI apparatus according to the present invention. First, an outline of the MRI apparatus to which the present invention is applied will be described. As shown in FIG. 1, MRI apparatus 10 comprises, as a measurement unit 100, a static magnetic field generation magnet 102, a gradient coil 103 configured to apply a magnetic field gradient to a static magnetic field, an RF transmission coil 104 configured to irradiate a subject 150 in a static magnetic field space with an RF magnetic field, an RF receive coil 105 configured to receive a nuclear magnetic resonance signal generated from a subject 150, an RF reception unit 107, an RF transmission unit 106 configured to supply RF pulse current to the RF transmission coil 104, a signal processing unit 108 configured to detect an NMR (nuclear magnetic resonance) signal received by the RF receive coil 105 to perform signal processing, and a gradient magnetic field power supply 109 configured to supply a current to the gradient coil 103. The subject 150 is laid on a table 101 and disposed in the static magnetic field space generated by the static magnetic field generation magnet 102.

Further, the MRI apparatus comprises, as a control/arithmetic system, a measurement control unit 110 configured to control operations of the RF transmission unit 106, the RF reception unit 107, the signal processing unit 108, and the gradient magnetic field power supply 109, a computer 111 including a CPU 113, a memory 112, and an internal storage device (not shown), an external storage device 114 connected to the computer 111, and a user interface (UI) unit 115 including a display device, an input device, and others. The computer 111 may be connected to an external network such as the Internet and an intranet, via a network IF (not shown).

The static magnetic field generation magnet 102 comprises a static magnetic field generating source of a permanent magnet type, a normal conducting type, or a superconducting type, and depending on the direction of the static magnetic field being generated, the magnet may be a vertical magnetic field type, a horizontal magnetic field type, and so on. The present invention can be applied to any type of the static magnetic field generation magnets.

The gradient coils 103 are wound respectively in three axial directions of X, Y, and Z, which are real space coordinate systems (stationary coordinate systems) of the MRI apparatus. Pulse-like current is supplied from the gradient magnetic field power supply 109 to each of the gradient coils, so that gradient magnetic field pulses can be applied in desired directions. By applying the gradient magnetic field, position information is added to the NMR signals. Specifically, for example, in the case of imaging a two-dimensional cross section (slice), a gradient magnetic field is applied in the slice direction, thereby determining the slice position. In the state that this slice position is excited, one of the two directions orthogonal to the slice plane is set as the phase encoding direction, and the other direction is set as the readout direction, and the gradient magnetic field pulses are applied respectively to the directions, thereby encoding the generated NMR signals in the respective directions. Usually, the NMR signals are collected as echo signals of the RF pulse or of the gradient magnetic field pulses, and thus they are also referred to as echo signals.

The RF transmission coil 104 generates a pulse-like induced magnetic field (RF pulse) by the RF pulse current supplied from the RF transmission unit 106. The RF pulse excites nuclear spins of the atoms constituting the tissue of the subject 150, and generates NMR signals. The RF receive coil 105 detects the echo signals from the subject 150 and sends the echo signals to the signal processing unit 108. The signal processing unit 108 performs quadrature detection and AD conversion on the echo signals to obtain time-series digital data, and then performs various processing required for image reconstruction.

Settings such as the intensity and timing of the RF pulse and the gradient magnetic field pulses of respective axes, and the timing of signal collection (sampling) are predetermined in the form of a pulse sequence for each imaging, and such settings are provided in the measurement control unit 110. The measurement control unit 110 uses thus provided pulse sequence, and imaging conditions and imaging parameters set by a user via the UI unit 115 so as to calculate the pulse sequence used for the imaging (imaging pulse sequence). Then, according to the calculated imaging pulse sequence, the measurement control unit 110 controls the RF transmission unit 106, the gradient magnetic field power supply 109, and the signal processing unit 108. This allows collection of echo data necessary for reconstructing the image of the subject 150.

The computer 111 functions as an overall controller to control the entire apparatus including the measurement unit 100 and the measurement control unit 110, and also functions as an arithmetic unit that performs various calculations using data such as the processing results from the signal processing unit 108. Data items such as the data required for the processing by the computer 111 and the data in the middle of processing are stored in the memory 112 or in the internal storage unit. Images as the processing results, calculation results, and others, can be displayed on the display of the UI unit 115, stored in the external storage device 114, and further transferred via a network. The user is allowed to set imaging parameters via the UI unit 115, and in addition, the user is also allowed to send a command or an instruction required for the processing in the computer 111.

In the MRI apparatus 10 of the present embodiment, the measurement unit 100 performs imaging using the SE pulse sequence under the control of the measurement control unit 110. In this situation, the measurement control unit 110 sets the excitation width of a 90° pulse to extend to be wider than the thickness (slice width) of the imaging plane provided as an imaging condition. Hereinafter, embodiments of a specific pulse sequence and control of the excitation width will be described.

First Embodiment

Figure 2:
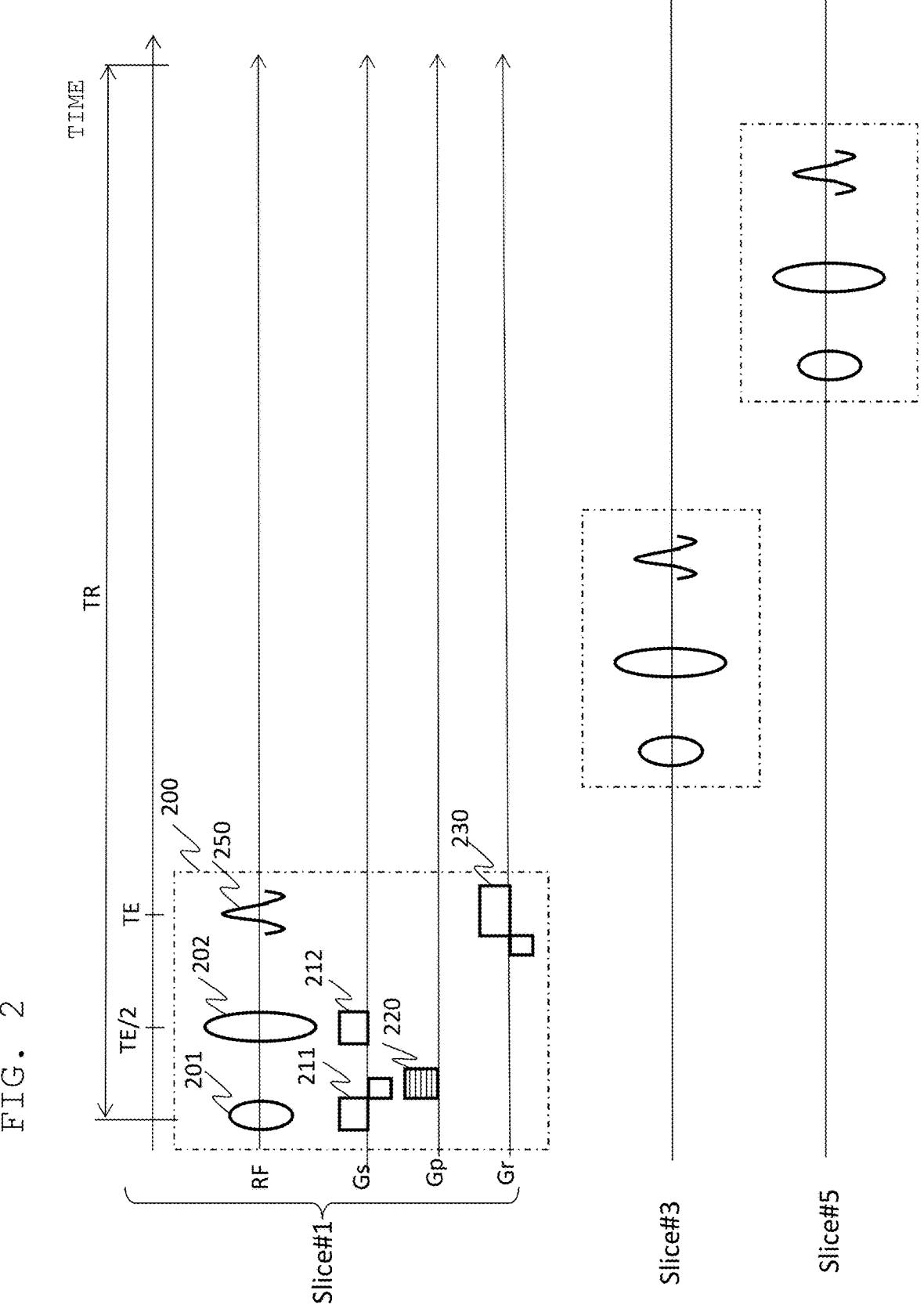
FIG. 2 illustrates a multi-slice imaging using an SE pulse sequence.

FIG. 2 illustrates an example of the SE pulse sequence executed by the MRI apparatus of the present embodiment. There are some types of imaging including three-dimensional imaging and two-dimensional imaging. In the three-dimensional imaging, a certain volume is excited at a time, and position information is given to the signals generated from within the volume after encoded by gradient magnetic field pulses. In the two-dimensional imaging, multiple cross sections (multi-slices) are sequentially excited and signals are collected for respective cross sections. FIG. 2 illustrates an example of the multi-slice two-dimensional imaging.

As illustrated, the SE pulse sequence applies an RF pulse (90° pulse) 201 for excitation and applies a 180° pulse 202 that reverses the magnetization after a lapse of a predetermined time (TE/2) to generate a spin echo 250 that peaks at the echo time (TE). When the 90° pulse 201 and the 180° pulse 202 are applied, slice gradient magnetic field pulses 211 and 212 are respectively applied for selecting a cross section to be simultaneously excited. Thereafter, the gradient magnetic field pulse 220 in the phase encoding direction is applied to give position information in the phase encoding direction to the echo signal, then a gradient magnetic field pulse 230 in the readout direction is applied, and the echo signals 250 are collected for a predetermined time. The sequence 200 is repeated for a predetermined repetition period TR while varying the application intensity of the gradient magnetic field pulse 220 in the phase encoding direction, and echo signals of the number required for image reconstruction are collected. Within the repetition time TR in the pulse sequence for the present cross section, the above sequence is performed for another cross section and the echo signals are collected as well. In FIG. 2, though the gradient magnetic field pulses in the slice direction (Gs), the phase encoding direction (Gp), and the readout direction (Gr) are not shown for other cross sections, they are the same as those for the slice #1, and the sequence 200 is repeated every TR.

In the multi-slice imaging, assuming that the cross sections are arranged in the spatial order of #1, #2, #3 . . . , the spatially continuous cross sections are usually not selected consecutive in time, but as shown in FIG. 2, for instance, the cross sections are selected every other one, such as #1, #3, #5, . . . and sequentially imaged.

Figure 3:
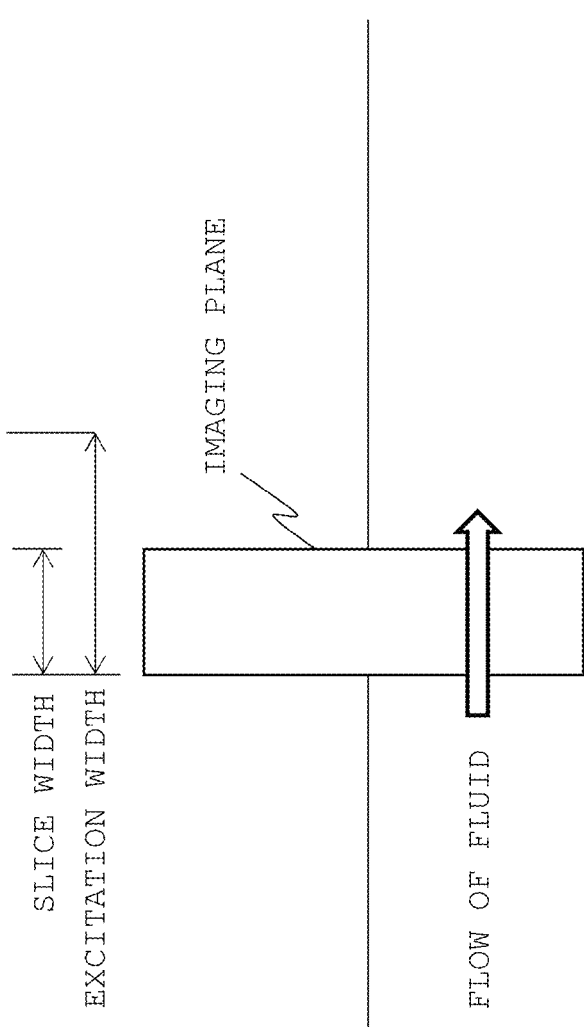
FIG. 3 illustrates an excitation range according to the present invention.

Here, in a typical SE pulse sequence, the 90° pulse and the 180° pulse are applied with selecting the same cross section. As shown in FIG. 3, the MRI apparatus of the present embodiment controls the 90° pulse and the gradient magnetic field pulses to be applied simultaneously in such a manner that the width of the region to be excited by the 90° pulse (excitation width) is extended to one side with respect to the imaging plane. That is, it is assumed that the excitation width corresponds to a width; including the imaging plane and a region that is adjacent to the imaging plane and located on the outflow side (downstream side) with respect to the inflow direction of the fluid (cerebrospinal fluid, blood, etc., hereinafter referred to as "blood" as a representative example), which flows into the imaging plane.

Which side is the downstream side is determined according to the information as the following; for example, regarding a blood vessel included in the imaging slice, when it is already known that the blood having a flow artifact as a problem flows through either an artery or a vein, the directions of the artery flow and the vein flow is substantially determined by the examination site. Thus, the user can designate the downstream side of the slice based on this information. Alternatively, when a positioning image (e.g., a scout image) for determining the slice upon imaging is displayed on the UI unit 115, a GUI for receiving a designation of the downstream side as to the examination site may be displayed, and the received information can be set in the measurement control unit 110.

Further, the range of the excitation width to be extended to one side of the imaging plane can be appropriately set considering other information such as the speed of the blood flow into the imaging plane. For example, it is preferable to set the range that can cover the region between the target imaging plane and the cross section to be imaged subsequent thereto. That is, it is preferable to set the excitation width such that the end of the region excited by the 90° pulse is as close as possible to the end of the next imaging plane.

The 180° pulse is applied without changing the position and width of the imaging plane which are provided as the imaging conditions.

The width and position of the region excited by the excitation pulse are determined by the center frequency and the bandwidth of the RF pulse, the envelope of the RF pulse, and the intensity of the slice gradient magnetic field pulse. Thus, adjustment of these information items allows variation of the position, width, and excitation profile of the cross section excited by the 90° pulse. Specific techniques for changing the width of the excited region will be described later.

In the MRI apparatus, when it is set to perform imaging, the computer (control unit) 111 provides via the UI unit 115, the pulse sequence and the imaging conditions (such as TE, TR, the slice number, the slice thickness, and the order of slice measurement) for executing the pulse sequence. Then, the computer controls the RF transmission unit 106 and the gradient magnetic field power supply 109 via the measurement control unit 110, to widen the region excited by the 90° pulse to the lower side of the imaging plane as shown in FIG. 3.

Other imaging processing steps are similar to those of conventional SE pulse sequence imaging. For example, when the imaging is the same as the multi-slice imaging as shown in FIG. 2, echo signals are sequentially collected for multiple cross sections, and images of the respective cross sections are reconstructed.

As described above, in the MRI apparatus of the present embodiment, in executing the SE pulse sequence, the excitation width of the 90° pulse is extended to the downstream side with respect to the imaging plane (the downstream side with respect to the blood flowing into the cross section). Thus, magnetization is reduced in the blood that is within the excitation width and to which the 90° pulse is applied, and when the blood flows into the imaging of the cross section on the downstream side, it is possible to reduce generation of signals that may cause artifacts in the cross section on the downstream side.

The blood in the upstream side of the imaging plane, flowing into the imaging plane, is not subjected to the application of the 90° pulse at the time of applying the 180° pulse (TE/2), and only the 180° pulse is applied. Therefore, no spin echo is generated in the echo time (TE). In addition, the blood to which both the 90° pulse and the 180° pulse are applied partially flows out from the imaging plane. Thus, this allows reduction of the spin echoes that cause the flow artifacts.

Figure 4:
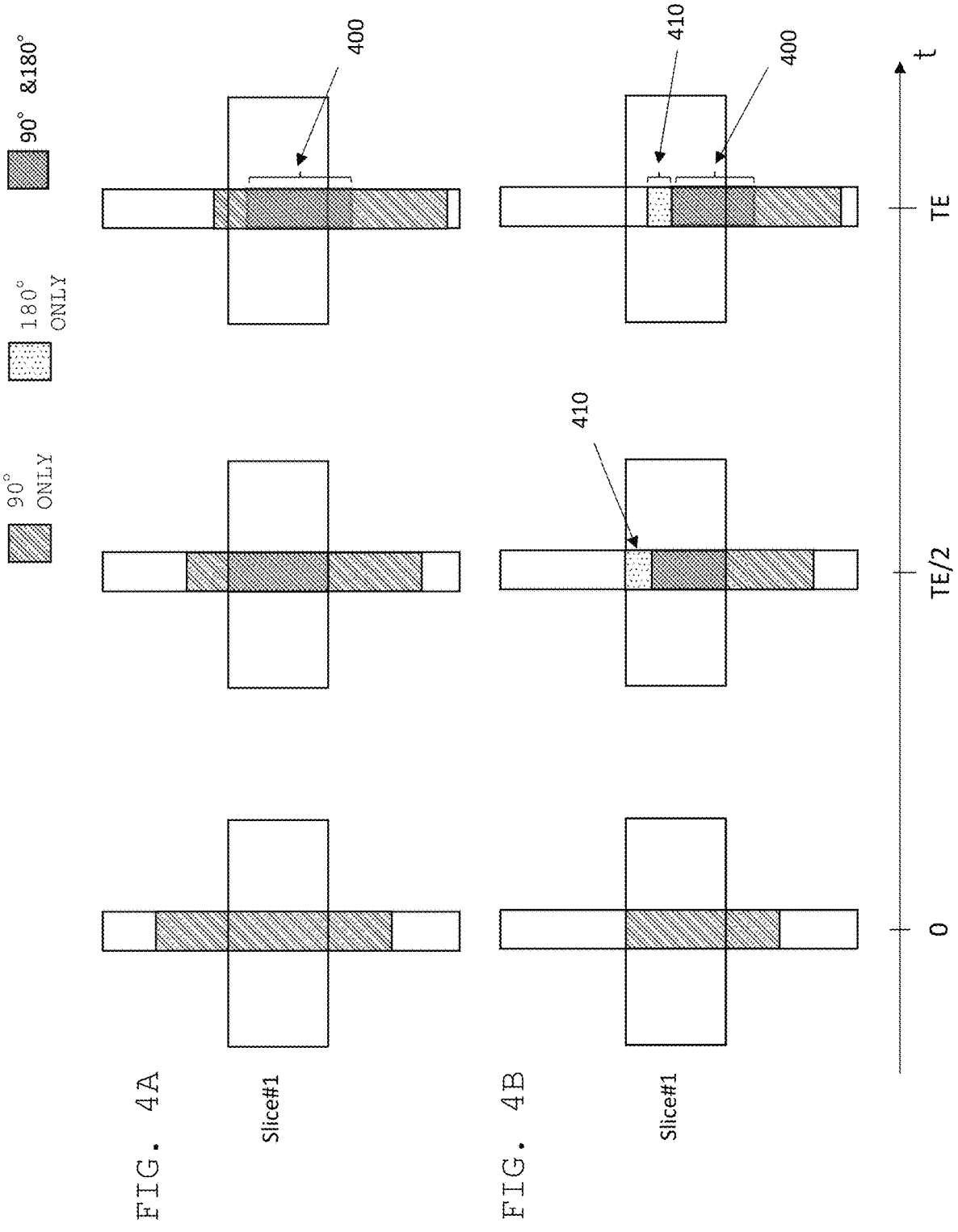
FIG. 4B illustrates the effect of the present invention, in comparison with FIG. 4A showing a publicly known technique.

FIGS. 4A and 4B illustrate a difference in effects between the case where the width excited by the 90° pulse is extended only to the downstream side (downstream side in the blood flow direction) of the imaging plane (FIG. 4B) and the case where the width excited by the 90° pulse is extended to both sides of the imaging plane (FIG. 4A) (technique disclosed by Patent Literature 1). In FIGS. 4A and 4B and subsequent figures, the slice and the blood flow are shown in a manner rotated by 90 degrees relative to the illustration of FIG. 3.

In both cases where the excitation width of the 90° pulse is extended to both sides (FIG. 4A) and where it is extended only to the downstream side (FIG. 4B), the blood located in the region on the downstream side of the imaging plane is reduced by the application of the 90° pulse, and therefore, both cases can contribute to reduction of the flow artifacts in imaging the subsequent cross section.

In the meantime, in FIG. 4A, at the time point (TE/2) when the 180° pulse is applied after the 90° pulse is applied, the blood 400 present in the imaging plane is applied with both the 90° pulse and the 180° pulse, resulting in that spin echoes are generated and flow artifacts are increased. On the other hand, in the case of FIG. 4B, the proportion of blood 400 that causes flow artifacts decreases by the amount of the blood 410 that has flowed into the imaging plane from the upstream side. In addition, the blood 410 is not subjected to application of the 90° pulse and only the 180° pulse is applied. Thus, the spin echo that causes flow artifacts is not generated in this portion, and the flow artifacts are not increased.

As is obvious from the comparison between the two cases above, according to the present embodiment, by extending the excitation width of the 90° pulse only to the downstream side to increase the thickness, it is possible to prevent the increase in artifacts of the imaging plane, in addition to the effect of reducing artifacts on the cross section on the downstream side.

Next, there will now be described examples of specific techniques for extending the excitation width.
Technique 1

Figure 5:
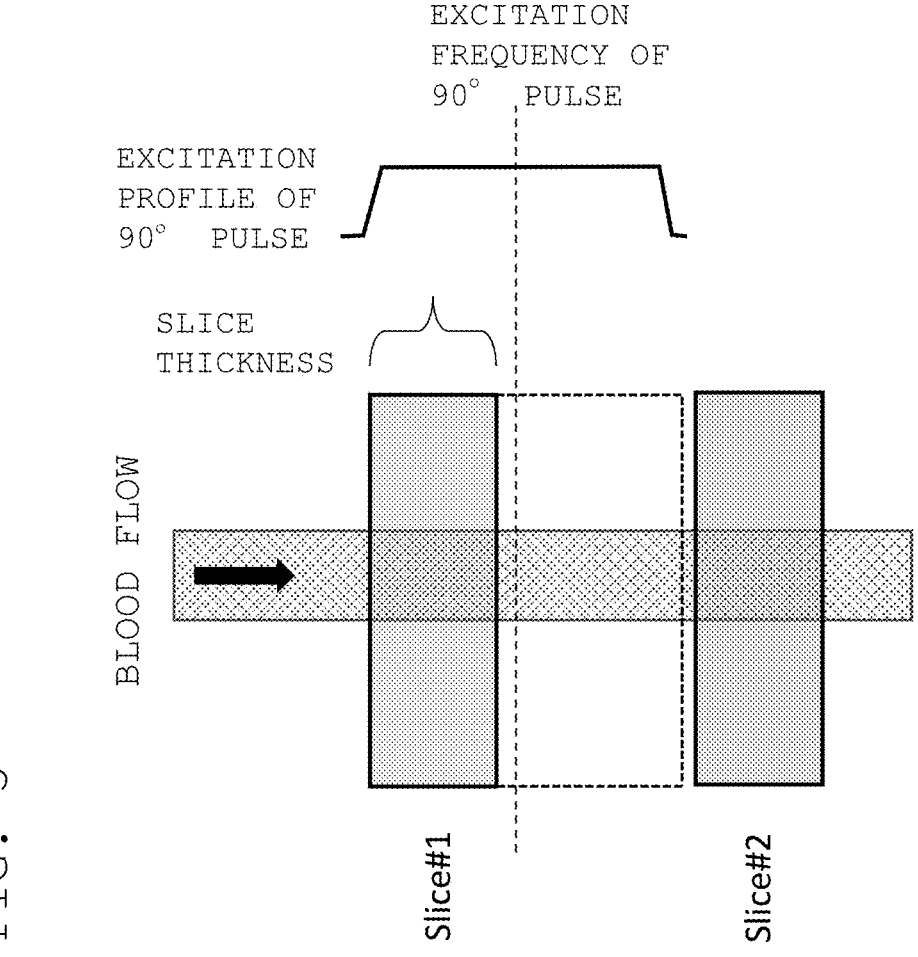
FIG. 5 illustrates a 90° pulse and an excitation range of Technique 1 according to the first embodiment.

In the present embodiment, as shown in FIG. 5, the center frequency (excitation frequency) of the 90° pulse is shifted to the downstream side and the excitation range is extended to the downstream side. Which side is the downstream side is determined as provided in advance by the user designation, for example. Assuming that the excitation width is {original excitation width/2+[shift amount of excitation position]}×2, it is possible to make one end of the original excitation width coincide with one end after the excitation width is extended. That is, the excitation range includes both the region of the target slice and the region on the downstream side of the slice.

The position (z) of the slice to be excited is determined by the center frequency and the gradient magnetic field intensity, and the excitation width is determined by the bandwidth or the gradient magnetic field intensity of the 90° pulse.

Thus, controlling and adjusting the values set in RF transmission unit 106 and the gradient magnetic field power supply 109 allow the excitation range to extend to the downstream side as shown in FIG. 5. These conditions for applying the 90° pulse may be set in the measurement control unit 110 at the time when the slice thickness and the order of slice measurement are provided. Alternatively, only adjustment amounts may be calculated in advance respectively for multiple slice thicknesses to select and apply an appropriate adjustment amount in accordance with the imaging conditions.

In the example illustrated in FIG. 5, Slice #1 and Slice #2 to be scanned next are not adjacent to each other, and the excitation range is extended in the region between the two slices. This technique can also be applied to the case where the slice #1 and the slice #2 are located within close vicinity of each other, or to the case where the region between them is narrow. In addition, FIG. 5 shows an example that the excitation position (center position), which corresponds to the excitation frequency after the shift, is located outside the slice #1. The excitation position, however, may be inside the slice #1 if the excitation range includes the downstream side of the slice #1.

According to the present technique, the excitation width can be easily adjusted by switching the conditions for applying the 90° pulse with respect to each slice.
Technique 2

This technique changes the excitation width using a 90° pulse that is referred to as a multi-band RF pulse.

Figure 6:
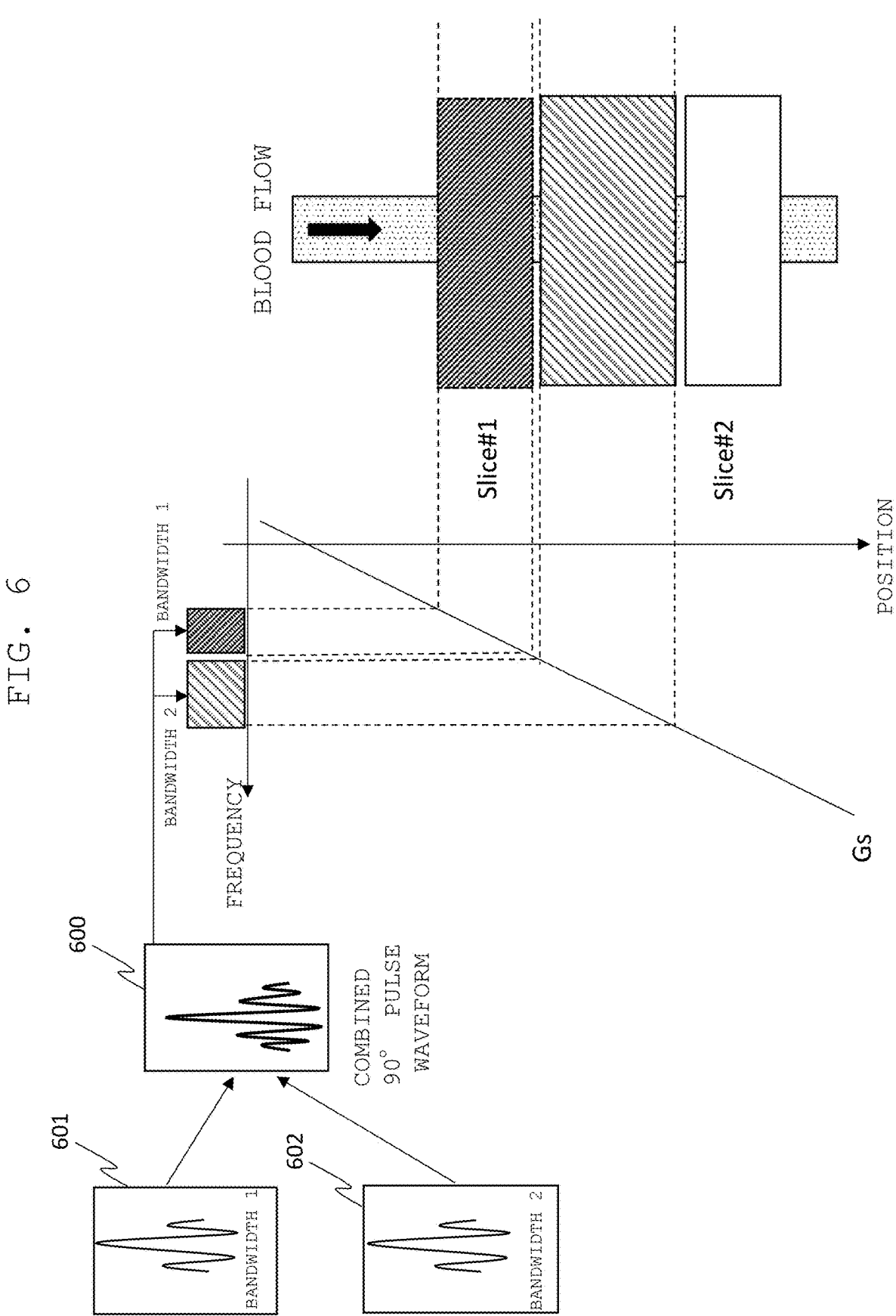
FIG. 6 illustrates the 90° pulse and the excitation range of Technique 2 according to the first embodiment.
Figure 7:
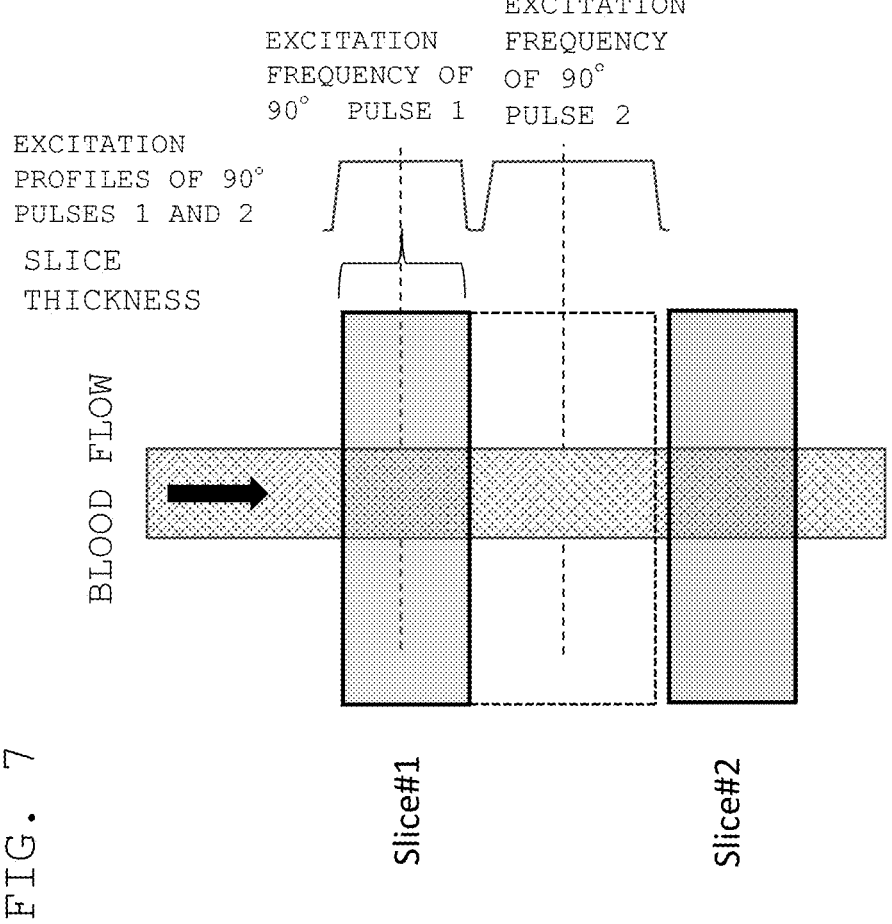
FIG. 7 illustrates the excitation range of Technique 2.

As shown in FIG. 6, the multi-band RF pulse is represented as the RF pulse 600 obtained by combining two types of RF pulses 601 and 602 having different center frequencies. One RF pulse 601 indicates the 90° pulse that causes the excitation position and the excitation range to be included in the scan targeted slice (here, slice #1), and the other RF pulse 602 is the 90° pulse that causes the excitation position and the excitation range to be included in a region on further downstream of the fluid flowing into the slice, than the slice to be scanned. The two 90° pulses 601 and 602 differ only in excitation frequency and have the same excitation width. By applying the combined multi-band RF pulses 600, the slice #1 and the neighboring downstream-side region are simultaneously excited, as shown in FIG. 7.

In the present technique as well, this multi-band RF pulse is prepared in advance, and the frequency is adjusted and applied for each slice position, so that excitation can be easily performed by the 90° pulse, allowing the excitation range to extend to the downstream side. In addition, in the present technique, unlike Technique 1, it is not necessary to adjust the bandwidth or the excitation frequency to be shifted, and thus the control can be performed more easily. In addition, since the excitation thicknesses of the two 90° pulses are kept thin, the individual excitation profiles can be kept clean. Accordingly, this may prevent the influence of extra excited magnetization at the edges of the profiles and inadvertent interference to the adjacent slice.
Technique 3

Figure 8:
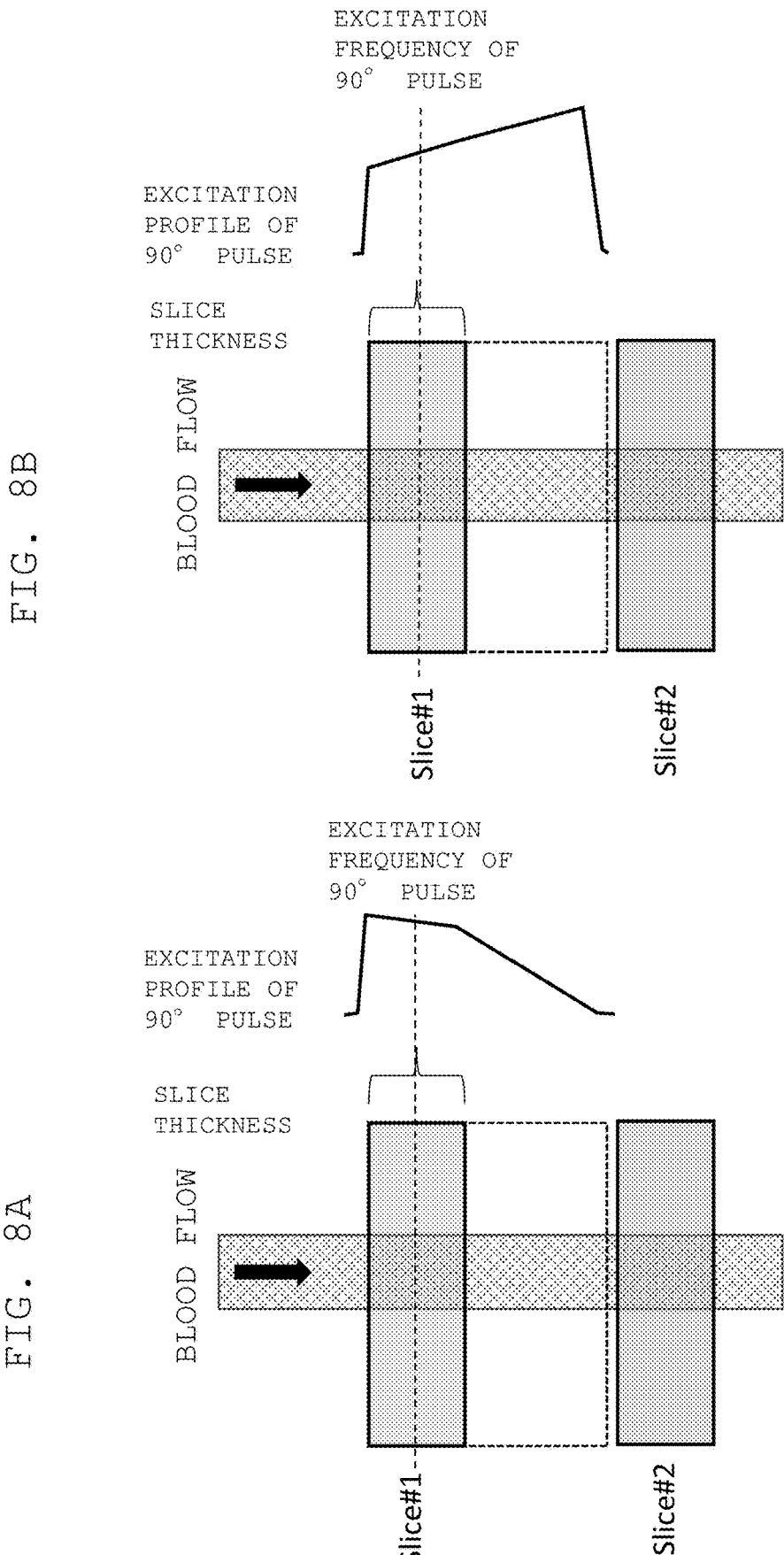
FIGS. 8A and 8B illustrate examples of excitation profile to describe the 90° pulse and the excitation range of Technique 3 according to the first embodiment.

In Technique 1, the center frequency of the 90° pulse is shifted. In the present technique, the excitation profile is deformed to an asymmetric shape about the position of the center frequency without changing the center frequency, thereby extending the excitation width to the downstream region adjacent to the slice. FIGS. 8A and 8B illustrate examples of this change of the excitation profile.

The example illustrated in FIG. 8A shows the excitation profile obtained by reducing the flip angle (FA) to the downstream side while maintaining the FA of 90° in the slice

1, and thereby widening the excitation range to the downstream side. The example illustrated in FIG. 8B shows that the FA of the slice #1 is 90° and the FA becomes larger than 90° toward the downstream side.

The excitation profile may have any of the shapes in FIGS. 8A and 8B, but in the case of FIG. 8A, by increasing the intensity in the slice to be scanned, high signal intensity can be ensured with preventing an increase of flow artifacts in the slice. In the case of FIG. 8B, by increasing the signal intensity on the downstream side, the effect for reducing artifacts can be improved, and this leads to enhancement of the effect to reduce the flow artifacts in the slice to be scanned next.

The shape of the excitation profile is determined by the shape of the RF pulse (the shape of the envelope), and Fourier-transforming of one shape gives the shape of the other. Generally, in order to obtain a rectangular excitation profile, the RF pulse takes the shape of the Sinc function. In this technique, the predetermined profile is determined, assuming that the shape obtained by Fourier-transforming a predetermined excitation profile represents the shape of the RF pulse. Accordingly, without changing the center frequency, it is possible to excite the range asymmetric with respect to the center frequency, that is, the range extended to the region adjacent to the slice plane.

The excitation profile with such deformed shape can be easily achieved by calculating the RF pulse shape superimposed on the RF signal in advance, and setting thus calculated RF pulse shape in the measurement control unit 110.

According to the present technique, it is not necessary to change the center frequency, and only the shape needs to be controlled. Therefore, the excitation width can be easily controlled by calculating the excitation profile in advance.

Second Embodiment

In the first embodiment, there has been described the case that when the excitation width is extended to a region located on the downstream side of inflowing fluid, a user designates which side is the downstream side with respect to the imaging plane according to an examination site. In the present embodiment, the system automatically makes this determination and controls the excitation width, based on the order of slice measurement (slice measurement order) set by the user. Other configurations are the same as those of the first embodiment.

When the user is aware of the blood flow (in an artery or in a vein) having a problem of flow artifacts, and the direction of the flow on the examination site, the user designates, in many cases, the measurement order to perform scanning from the upstream side of the flow, aiming at an effect of reduction in flow artifacts after applying the excitation pulses repeatedly.

Figure 9:
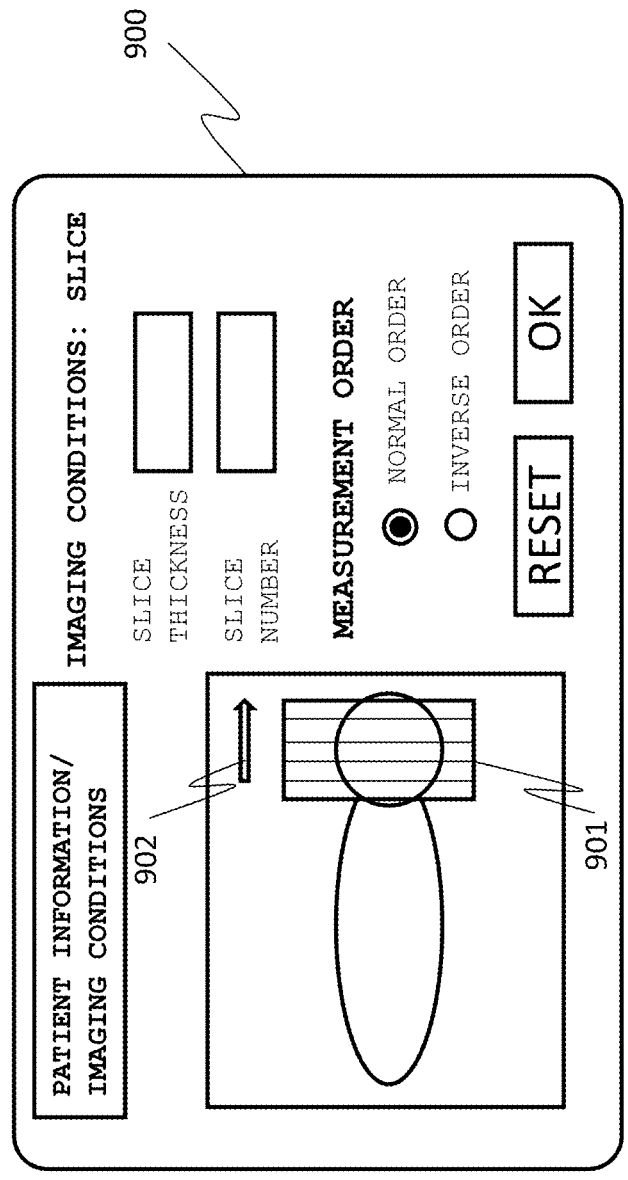
FIG. 9 illustrates an example of a display screen of an UI unit according to the second embodiment.

The measurement control unit 110 extends the excitation width to the downstream side, automatically following the order based on the designated measurement order. In this case, for example, as illustrated in FIG. 9, there may be provided a GUI displaying the information such as the slice positions 901 and the measurement order information 902 on the display screen 900 of the UI unit 115, prompting the user to make an approval or correction.

According to the present embodiment, it is possible to reduce the burden on the user in setting the imaging conditions. Further, displaying on the UI unit 115 the automatically determined result regarding the region in which the excitation width is extended, can prompt the user to change the measurement order, or to change the region where the excitation width is extended. Therefore, this enhances the effectiveness in reducing the flow artifacts.

There have been described so far, the embodiments of the MRI apparatus and the control method thereof according to the present invention. The present invention is, however, intended to extend the excitation width of the 90° pulse only to the downstream side of the fluid flowing into the imaging plane. More specifically, within this scope of the invention, the present invention is not limited to the exemplary embodiments described herein. In the embodiments, the multi-slice imaging for imaging multiple cross sections has been described as an example, but the present invention can be applied to a case where only one imaging plane is imaged, or a case where a predetermined volume is imaged. It is also noted that the present invention can be combined with other known techniques, such as addition of flow-compensation pulses.

What is claimed is:

1. A magnetic resonance imaging apparatus comprising,
a measurement unit configured to apply an RF pulse to excite a predetermined cross section of an examination subject and gradient magnetic field pulses, and to collect nuclear magnetic resonance signals generated from the predetermined cross section, and
a measurement control unit configured to control the measurement unit so that the measurement unit collects the nuclear magnetic resonance signals according to a spin-echo pulse sequence, and to control at least either of an excitation pulse and the gradient magnetic field pulse included in the spin-echo pulse sequence in such a manner that a width in a thickness direction of the predetermined cross section excited by the excitation pulse in the spin-echo pulse sequence is extended from an imaging plane of the predetermined cross section only to a downstream side of a liquid that flows into the predetermined cross section, so that the width includes the predetermined cross section and a region adjacent to the predetermined cross section on the downstream side, and the width, after being extended, does not include any region adjacent to the predetermined cross section to an upstream side of the liquid that flows into the predetermined cross section.

2. The magnetic resonance imaging apparatus according to claim 1, wherein the measurement control unit shifts a center frequency of the excitation pulse to a further downstream side than a center of the predetermined cross section in the thickness direction.

3. The magnetic resonance imaging apparatus according to claim 2, wherein
the measurement control unit provides as an excitation profile of the excitation pulse, a trapezoidal-shaped profile throughout the region that is excited by the excitation pulse.

4. The magnetic resonance imaging apparatus according to claim 1, wherein
the excitation pulse excites two cross sections simultaneously, and
the measurement control unit controls a position for excitation of the excitation pulse in such a manner that one of the two cross sections corresponds to the predetermined cross section and the other corresponds to a region on the downstream side.

5. The magnetic resonance imaging apparatus according to claim 1, wherein the measurement control unit sets a center frequency of the excitation pulse to be positioned at a center of the predetermined cross section in the thickness direction, and provides an excitation profile of the excitation pulse, the profile having excitation intensity that is different (a) within the predetermined cross section as compared to (b) within the region on the downstream side.

6. The magnetic resonance imaging apparatus according to claim 5, wherein the measurement control unit provides the excitation profile in which the excitation intensity increases monotonously from an end of the predetermined cross section to an end of the region on the downstream side.

7. The magnetic resonance imaging apparatus according to claim 5, wherein the measurement control unit provides the excitation profile in which the excitation intensity is maximized in the predetermined cross section and decreases toward an end of the region on the downstream side.

8. The magnetic resonance imaging apparatus according to claim 1, further comprising a UI unit configured to receive user's designation of the predetermined cross section, wherein the measurement control unit determines the region on the downstream side of the predetermined cross section based on a measurement order, when the UI unit receives designation of the measurement order as to multiple cross sections.

9. The magnetic resonance imaging apparatus according to claim 1, wherein the measurement control unit controls the measurement unit so that the nuclear magnetic resonance signals are sequentially collected as to multiple predetermined cross sections, and the measurement control unit also controls a measurement order in such a manner that the predetermined cross sections adjacent in time for collecting nuclear magnetic resonance signals are spatially apart.

10. A control method of a magnetic resonance imaging apparatus provided with an RF magnetic field generation unit configured to generate an RF magnetic field to be applied to the examination subject, a gradient magnetic field generation unit configured to generate a gradient magnetic field in a space in which the examination subject is placed, and a measurement unit configured to measure a nuclear magnetic resonance signal generated from the examination subject, the magnetic resonance imaging apparatus being operated according to a predetermined pulse sequence, and the control method comprising:

using as the pulse sequence, a spin-echo pulse sequence that includes application of a 90° pulse and application of a 180° pulse and measures a spin echo from a predetermined cross section of the examination subject;

controlling one or more of an excitation pulse and the gradient magnetic field pulse included in the spin-echo pulse sequence in such a manner that a width in a thickness direction of the predetermined cross section excited by the excitation pulse in the spin-echo pulse sequence is extended from an imaging plane of the predetermined cross section only to a downstream side of a liquid that flows into the predetermined cross section, so that the width includes the predetermined cross section and a region adjacent to the predetermined cross section on the downstream side, and the width, after being extended, does not include any other region adjacent to the predetermined cross section to an upstream side of the liquid that flows into the predetermined cross section; and collecting the nuclear magnetic resonance signals from the predetermined cross section, with setting a range excited by the 90° pulse as a range that includes the predetermined cross section and the region adjacent to the predetermined cross section and located on the downstream side of a fluid flowing into the predetermined cross section, and setting a range to apply the 180° pulse to coincide with the range of the predetermined cross section.

11. The control method of the magnetic resonance imaging apparatus according to claim 10, further comprising repeating collection of the nuclear magnetic resonance signals as to multiple cross sections while shifting the predetermined cross section to the downstream side.

* * * * *